(12) United States Patent
Yamazaki

(10) Patent No.: US 6,618,419 B1
(45) Date of Patent: Sep. 9, 2003

(54) SEMICONDUCTOR LASER

(75) Inventor: Hiroyuki Yamazaki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/715,092

(22) Filed: Nov. 20, 2000

(30) Foreign Application Priority Data

Nov. 18, 1999 (JP) .......................................... 11-328859

(51) Int. Cl.[7] .................................................. H01S 5/00
(52) U.S. Cl. ............................ 372/49; 372/46; 372/99
(58) Field of Search ........................... 372/45, 49, 98, 372/99, 46; 257/98

(56) References Cited

U.S. PATENT DOCUMENTS

| | | | |
|---|---|---|---|
| 5,224,113 A | 6/1993 | Tsang | 372/45 |
| 5,801,403 A * | 9/1998 | He | 372/49 |
| 6,396,861 B1 * | 5/2002 | Shimizu et al. | 372/45 |

FOREIGN PATENT DOCUMENTS

| | | |
|---|---|---|
| JP | 6-268312 | 9/1994 |
| JP | 7-202319 | 8/1995 |
| JP | 9-199782 | 7/1997 |

OTHER PUBLICATIONS

Electronics Letters, vol. 31, No. 16, 1995, pp. 1344–1345, Aug. 1995.
Electronics Letters, vol. 33, No. 22, 1997, pp. 1869–1871, Oct. 1997.
Tsang et al., "Low threshold and high power output 1.5 μm InGaAs/InGaAsP separate confinement multiple quantum well laser grown by chemical beam epitaxy", Appln. Phys. Lett., vol. 57, No. 20, 1990, pp. 2065–2067, Nov. 1990.
Proc. SPIE Int. Soc. Opt. Eng. Semiconductor Lasers II, vol. 2886, 1996, pp. 114–117, Aug. 1996.

* cited by examiner

*Primary Examiner*—Minh Loan Tran
(74) *Attorney, Agent, or Firm*—Young & Thompson

(57) ABSTRACT

A seminconductor laser having at least a cavity, wherein the cacvity satisfies the following equations:

$$L = A + B \times \ln(1/Rf)$$

where A and B are first and second constants, and L is a length of the cavity, and Rf is a reflectance factor of a front facet of the cavity.

29 Claims, 11 Drawing Sheets

SEMICONDUCTOR LASER

BACKGROUND OF THE INVENTION

The present invention relates to a semiconductor laser, and more particularly to a semiconductor laser having a cavity and emitting a light upon current injection.

Generally, a semiconductor laser is smaller in size than a solid state laser and a gas laser. The semiconductor laser is higher in energy conversion efficiency than the solid state laser and the gas laser. For those reasons, the semiconductor laser has widely been used in various fields. In order to widen the fields to which the semiconductor laser is applied, it is important to realize a further increase in the output of the semiconductor laser. In case of a short wavelength of not more than 1 micrometer, the maximum acceptable output of the semiconductor laser is limited by a maximum value of the acceptable light density range which prevents a facet of a cavity of the semiconductor laser from being broken. In case of a long wavelength of not less than 1 micrometer, the maximum acceptable output of the semiconductor laser is limited by the maximum value of the acceptable heat generation range, wherein the heat generation is mainly due to the current injection. A wavelength band of 1.48 micrometers is an excitation wavelength of an erbium-doped optical fiber amplifier having a high amplification property. Such the optical fiber amplifier needs a high output semiconductor laser. Further, in recent years, data traffic of advanced communication systems or networks such as internet has been on the rapid increase. In this circumstances, it has been required to further increase the channel number of the multiple channels in the wavelength-division multiplex communication. In order to respond to this requirement, it is necessary to increase the output of the semiconductor laser as an excitation source for the erbium-doped optical fiber amplifier so that a saturation output of the erbium-doped optical fiber amplifier is increased.

In case of the semiconductor laser having the wavelength of 1.48 micrometers, it has been known that the length of the cavity is increased to reduce a heat resistance, and that the generated heat is transferred to a heat sink or a stem. A first conventional semiconductor laser is disclosed in IEEE Photonics Technology Letters, vol. 6, No. 1, p. 4, January 1994. The length of the cavity of the semiconductor laser is made long or increased to 1.2 millimeters. A reflectance factor of a front facet of the cavity is 5%. A reflectance factor of a rear facet of the cavity is 95%. A maximum optical output reaches 360 mW. Further, current confinement structures which comprise p-n-p-n thyristors are provided in both sides of an active layer of the semiconductor laser. A width of the active layer is about 2 micrometers, so that the semiconductor laser shows a light emission in a single transverse mode, thereby realizing a highly efficient coupling between the semiconductor laser and an optical fiber.

In order to realize a furthermore increase in the optical output of the semiconductor laser, it is necessary that the length of the cavity of the semiconductor laser is further increased and the heat resistance and a device resistance are reduced for reducing the heat generation. The increase in the length of the cavity of the semiconductor laser causes a reduction in slope efficiency of the semiconductor laser. The reduction in slope efficiency of the semiconductor laser causes an increase in the necessary driving current of the semiconductor laser. FIG. 1 is a diagram illustrative of variations in optical outputs over injection current of three semiconductor lasers having different cavity lengths of 1.2 millimeters, 2.4 millimeters, and 3.6 millimeters, provided that a reflectance factor of a front facet of the cavity is fixed at 5% and a reflectance factor of a rear facet of the cavity is fixed at 95%. From FIG. 1, it is understood that if the reflectance factors of the front and rear facets of the cavity are fixed, then the increase in length of the cavity causes a slight increase in optical output of the semiconductor laser. Namely, the effect of increasing the optical output of the semiconductor laser by the increase in length of the cavity is small as long as the reflectance factors of the front and rear facets of the cavity are fixed.

In order to have solved the above problem, a second conventional semiconductor laser has been proposed, wherein a width of a waveguide of the semiconductor laser is widen to about 100 micrometers for reducing the device resistance, so that the heat generation is reduced, thereby obtaining an optical output in watt-order. This second conventional semiconductor laser is disclosed in Electronics Letters, vol. 35, No. 12, p. 983, June 1999.

The second conventional semiconductor laser is too wide in waveguide width to allow that the semiconductor laser shows a light emission in the single transverse mode. If the semiconductor laser is coupled to an optical fiber, then it is necessary that the semiconductor laser emits light in the single transverse mode. The second conventional semiconductor laser is hard to emit light in the single transverse mode, then it is difficult that the second conventional semiconductor laser is coupled to the optical fiber.

In order to solve this problem, it might be proposed to modify the second conventional semiconductor laser so that the waveguide has a flared structure, wherein the waveguide increases in width toward a front facet, form which a light is emitted, whilst the waveguide decreases in width toward a rear facet which is coupled to the optical fiber. The width of the waveguide at the rear facet is made narrow so as to satisfy the condition for the single transverse mode. The width of the waveguide gradually increases toward the front facet, form which the light is emitted. The flared structure allows the second conventional semiconductor laser to emit the light in the single transverse mode. The modified second conventional semiconductor with the flared structure has a coupling loss of 40% to the single mode optical fiber, provided specific lens systems are essential, which make it difficult to form an optical module.

In the above circumstances, it had been required to develop a novel semiconductor laser free from the above problem.

SUMMARY OF THE INVENTION

Accordingly, it is an object of the present invention to provide a novel semiconductor laser free from the above problems.

It is a further object of the present invention to provide a novel semiconductor laser having a long cavity length and a high slope efficiency.

It is a still further object of the present invention to provide a novel semiconductor laser reduced in thermal resistance.

It is yet a further object of the present invention to provide a novel semiconductor laser reduced in device resistance.

It is further more object of the present invention to provide a novel semiconductor laser which reduces a heat generation upon current injection.

It is moreover object of the present invention to provide a novel semiconductor laser improved in heat radiation feature.

It is yet moreover object of the present invention to provide a novel semiconductor laser improved in high output characteristics.

The first present invention provides a semiconductor laser having at least a cavity, wherein the cavity satisfies the following equation:

$$L=A+B\times \ln(1/Rf)$$

where A and B are first and second constants, and L is a length of the cavity, and Rf is a reflectance factor of a front facet of the cavity.

The second present invention provides a semiconductor laser having at least a cavity, wherein the cavity satisfies the following equation:

$$\alpha m=(1/2L)\times \ln[1/(Rf\times Rr)]$$

where αm in is the mirror loss of the cavity, L is the length of the cavity, Rf is the reflectance factor of a front facet of the cavity, and the Rr is a reflectance factor of a rear facet of the cavity.

The third present invention provides a semiconductor laser having at least a cavity, wherein a length of the cavity is not less than 1.5 millimeters, and a reflectance factor of a front facet of the cavity is not more than 2%.

The fourth present invention provides a method of designing a cavity of a semiconductor device, wherein the following equation is satisfied:

$$L=A+B\times \ln(1/Rf)$$

where A and B are first and second constants, and L is a length of the cavity, and Rf is a reflectance factor of a front facet of the cavity.

The fifth present invention provides a method of designing a cavity of a semiconductor device, wherein the cavity satisfies the following equation:

$$\alpha m=(1/2L)\times \ln[1/(Rf\times Rr)]$$

where αm is the mirror loss of the cavity, L is the length of the cavity, Rf is the reflectance factor of a front facet of the cavity, and the Rr is a reflectance factor of a rear facet of the cavity.

The sixth present invention provides a method of designing a cavity of a semiconductor device, wherein a length of the cavity is not less than 1.5 millimeters, and a reflectance factor of a front facet of the cavity is not more than 2%.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
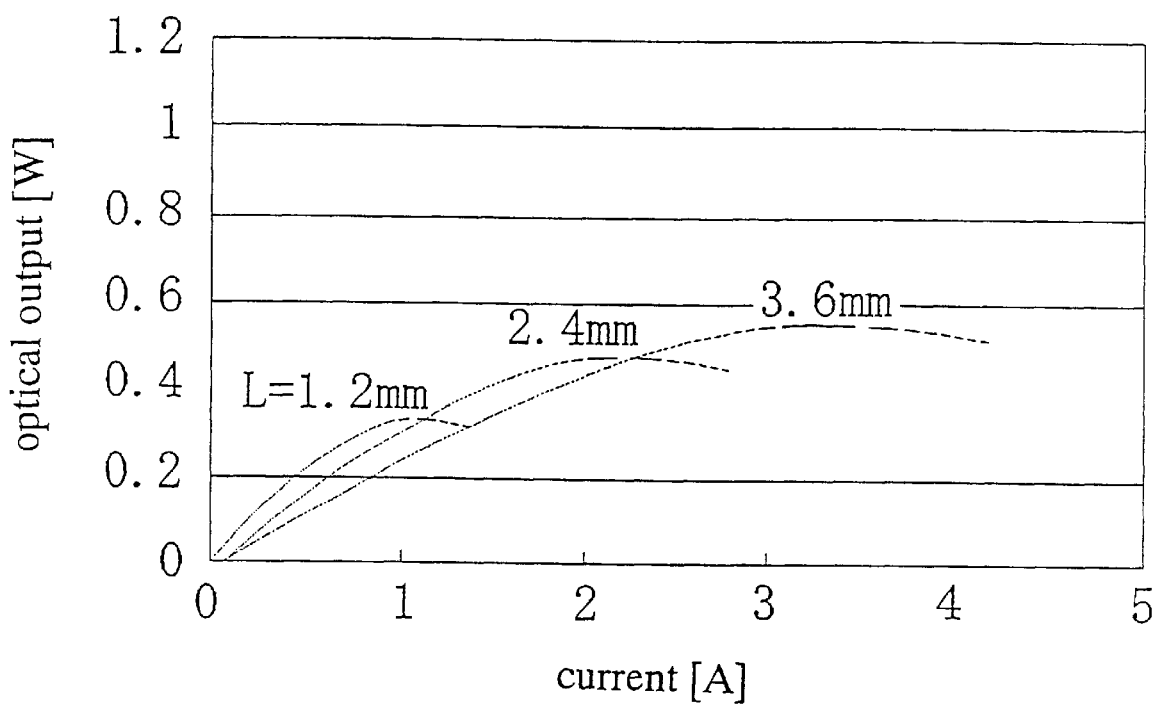
FIG. 1 is a diagram illustrative of variations in optical outputs over injection current of three semiconductor lasers having different cavity lengths of 1.2 millimeters, 2.4 millimeters, and 3.6 millimeters, provided that a reflectance factor of a front facet of the cavity is fixed at 5% and a reflectance factor of a rear facet of the cavity is fixed at 95%.

The first present invention provides a semiconductor laser having at least a cavity, wherein the cavity satisfies the following equation:

$$L=A+B\ln(1/Rf)$$

where A and B are first and second constants, and L is a length of the cavity, and Rf is a reflectance factor of a front facet of the cavity.

It is, therefore, preferable that a length of the cavity is not less than 1.5 millimeters, and a reflectance factor of a front facet of the cavity is not more than 2%.

It is further preferable that the length of the cavity is not less than 2 millimeters, and the reflectance factor of the front facet of the cavity is not more than 1%.

It is still further preferable that the length of the cavity is not less than 3.6 millimeters, and the reflectance factor of the front facet of the cavity is not more than 0.01%.

It is also preferable that in the equation, the first constant A and the second constant B are given by:

A={1/(2×m)}ln[1/(Rr)]; and

B=1/(2×m)

where m is a mirror loss of the cavity, and the Rr is a reflectance factor of a rear facet of the cavity.

It is further preferable that a mirror loss of the cavity is not more than 13 $cm^{-1}$.

It is also preferable that a reflectance factor of a rear facet of the cavity is not less than 90%.

It is also preferable that the cavity has a width in the range of 1 micrometer to 10 micrometers, so that the semiconductor laser emits a light in the single transverse mode, whereby the semiconductor laser is coupled to an optical fiber.

It is also preferable that the cavity comprises at least a semiconductor layer interposed between a first semiconductor region of a first conductivity type and a second semiconductor region of a second conductivity type, and the semiconductor layer is lower in energy band gap than the first and second semiconductor regions, and the first and second semiconductor regions are respectively provided with first and second electrodes for a current injection.

It is further preferable that the at least semiconductor layer comprises a single quantum well structure.

It is also preferable that the at least semiconductor layer comprises a multiple quantum well structure.

It is also preferable that the semiconductor laser has at least a separate confinement hetero-structure.

It is also preferable that the semiconductor laser has at least a current confinement structure.

The second present invention provides a semiconductor laser having at least a cavity, wherein the cavity satisfies the following equation:

$$m = (½L) \times \ln[1/(Rf \times Rr)]$$

where m is the mirror loss of the cavity, L is the length of the cavity, Rf is the reflectance factor of a front facet of the cavity, and the Rr is a reflectance factor of a rear facet of the cavity.

It is also preferable that the mirror loss of the cavity is not more than 13 cm$^{-1}$, the length of the cavity is not less than 1.5 millimeters, and the reflectance factor of the front facet of the cavity is not more than 2%, and the reflectance factor of the rear facet of the cavity is not less than 90%.

It is further preferable that the length of the cavity is not less than 2 millimeters, and the reflectance factor of the front facet of the cavity is not more than 1%.

It is further more preferable that the length of the cavity is not less than 3.6 millimeters, and the reflectance factor of the front facet of the cavity is not more than 0.01%.

It is also preferable that the cavity has a width in the range of 1 micrometer to 10 micrometers, so that the semiconductor laser emits a light in the single transverse mode, whereby the semiconductor laser is coupled to an optical fiber.

It is also preferable that the cavity comprises at least a semiconductor layer interposed between a first semiconductor region of a first conductivity type and a second semiconductor region of a second conductivity type, and the semiconductor layer is lower in energy band gap than the first and second semiconductor regions, and the first and second semiconductor regions are respectively provided with first and second electrodes for a current injection.

It is further preferable that the at least semiconductor layer comprises a single quantum well structure.

It is also preferable that the at least semiconductor layer comprises a multiple quantum well structure.

It is also preferable that the semiconductor laser has at least a separate confinement hetero-structure.

It is also preferable that the semiconductor laser has at least a current confinement structure.

The third present invention provides a semiconductor laser having at least a cavity, wherein a length of the cavity is not less than 1.5 millimeters, and a reflectance factor of a front facet of the cavity is not more than 2%.

It is preferable that the length of the cavity is not less than 2 millimeters, and the reflectance factor of the front facet of the cavity is not more than 1%.

It is further preferable that the length of the cavity is not less than 3.6 millimeters, and the reflectance factor of the front facet of the cavity is not more than 0.01%.

It is also preferable that a mirror loss of the cavity is not more than 13 cm$^{-1}$.

It is also preferable that a reflectance factor of a rear facet of the cavity is not less than 90%.

It is also preferable that the cavity satisfies the following equation:

$$m = ½L \ln[1/(Rf \times Rr)]$$

where m is the mirror loss of the cavity, L is the length of the cavity, Rf is the reflectance factor of the front facet of the cavity, and the Rr is a reflectance factor of a rear facet of the cavity.

It is also preferable that the cavity has a width in the range of 1 micrometer to 10 micrometers, so that the semiconductor laser emits a light in the single transverse mode, whereby the semiconductor laser is coupled to an optical fiber.

It is also preferable that the cavity comprises at least a semiconductor layer interposed between a first semiconductor region of a first conductivity type and a second semiconductor region of a second conductivity type, and the semiconductor layer is lower in energy band gap than the first and second semiconductor regions, and the first and second semiconductor regions are respectively provided with first and second electrodes for a current injection.

It is further preferable that the at least semiconductor layer comprises a single quantum well structure.

It is also preferable that the at least semiconductor layer comprises a multiple quantum well structure.

It is also preferable that the semiconductor laser has at least a separate confinement hetero-structure.

It is also preferable that the semiconductor laser has at least a current confinement structure.

The fourth present invention provides a method of designing a cavity of a semiconductor device, wherein the following equation is satisfied:

$$L = A + B \ln(1/Rf)$$

where A and B are first and second constants, and L is a length of the cavity, and Rf is a reflectance factor of a front facet of the cavity.

It is preferable that a length of the cavity is not less than 1.5 millimeters, and a reflectance factor of a front facet of the cavity is not more than 2%.

It is further preferable that the length of the cavity is not less than 2 millimeters, and the reflectance factor of the front facet of the cavity is not more than 1%.

It is further more preferable that the length of the cavity is not less than 3.6 millimeters, and the reflectance factor of the front facet of the cavity is not more than 0.01%.

It is also preferable that in the equation, the first constant A and the second constant B are given by:

$A = \{1/(2 \times m)\} \ln[1/(Rr)]$; and $B = 1/(2 \times m)$ where m is a mirror loss of the cavity, and the Rr is a reflectance factor of a rear facet of the cavity.

It is also preferable that a mirror loss of the cavity is not more than 13 cm$^{-1}$.

It is also preferable that a reflectance factor of a rear facet of the cavity is not less than 90%.

It is also preferable that the cavity has a width in the range of 1 micrometer to 10 micrometers, so that the semiconductor laser emits a light in the single transverse mode, whereby the semiconductor laser is coupled to an optical fiber.

The fifth present invention provides a method of designing a cavity of a semiconductor device, wherein the cavity satisfies the following equation:

$$\alpha m = (\tfrac{1}{2}L) \times \ln[1/(Rf \times Rr)]$$

where αm is the mirror loss of the cavity, L is the length of the cavity, Rf is the reflectance factor of a front facet of the cavity, and the $R_r$ is a reflectance factor of a rear facet of the cavity.

It is preferable that the mirror loss of the cavity is not more than 13 cm$^{-1}$, the length of the cavity is not less than 1.5 millimeters, and the reflectance factor of the front facet of the cavity is not more than 2%, and the reflectance factor of the rear facet of the cavity is not less than 90%.

It is also preferable that the length of the cavity is not less than 2 millimeters, and the reflectance factor of the front facet of the cavity is not more than 1%.

It is further preferable that the length of the cavity is not less than 3.6 millimeters, and the reflectance factor of the front facet of the cavity is not more than 0.01%.

It is also preferable that the cavity has a width in the range of 1 micrometer to 10 micrometers, so that the semiconductor laser emits a light in the single transverse mode, whereby the semiconductor laser is coupled to an optical fiber.

The sixth present invention provides a method of designing a cavity of a semiconductor device, wherein a length of the cavity is not less than 1.5 millimeters, and a reflectance factor of a front facet of the cavity is not more than 2%.

It is also preferable that the length of the cavity is not less than 2 millimeters, and the reflectance factor of the front facet of the cavity is not more than 1%.

It is also preferable that the length of the cavity is not less than 3.6 millimeters, and the reflectance factor of the front facet of the cavity is not more than 0.01%.

It is also preferable that a mirror loss of the cavity is not more than 13 cm$^{-1}$.

It is also preferable that a reflectance factor of a rear facet of the cavity is not less than 90%.

It is also preferable that the cavity satisfies the following equation:

$$\alpha m = \tfrac{1}{2} L \ln[1/(Rf \times Rr)]$$

where $\alpha_m$ is the mirror loss of the cavity, L is the length of the cavity, $R_f$ is the reflectance factor of the front facet of the cavity, and the $R_r$ is a reflectance factor of a rear facet of the cavity.

It is also preferable that the cavity has a width in the range of 1 micrometer to 10 micrometers, so that the semiconductor laser emits a light in the single transverse mode, whereby the semiconductor laser is coupled to an optical fiber.

It is important for the semiconductor laser or the laser diode to improve the output characteristic thereof. The increase in length of the cavity of the semiconductor laser or the laser diode allows reductions in device resistance and heat resistance to reduce the heat generation upon the current injection, thereby make it possible to increase the optical output of the semiconductor laser or the laser diode. The mere increase in only the length of the cavity of the semiconductor laser or the laser diode causes the reduction in the slope efficiency of the semiconductor laser or the laser diode, whereby the necessary driving current for emitting the light is increased.

In accordance with the first to sixth present inventions, however, the cavity of the semiconductor laser or the laser diode is so designed to avoid any substantive reduction in the slope efficiency of the semiconductor laser or the laser diode, even the length of the cavity is increased. The slope efficiency depends upon both the length of the cavity and reflectance factors of front and rear facets of the cavity. The light is emitted from the front facet of the cavity. If the length of the cavity is increased and if the reflectance factors of front and rear facets of the cavity are fixed, then the slope efficiency is reduced. If the length of the cavity is fixed and if the reflectance factor of the rear facet of the cavity is fixed and further if the reflectance factor of the front facet of the cavity is reduced, then the slope efficiency is increased. In accordance with the present invention, the reflectance factor of the front facet of the cavity is so reduced as to compensate the increment in the slope efficiency upon increases in the length of the cavity, wherein the reflectance factor of the rear facet of the cavity is kept high. Namely, the reflectance factor of the front facet of the cavity is reduced in place of the increase in the length of the cavity in order to prevent any substantive reduction in the slope efficiency. The reduction in the reflectance factor of the front facet of the cavity makes it possible for the semiconductor laser with the long cavity length to obtain the slope efficiency so high as when the length of the cavity is short. The slope efficiency has a one-to-one correspondence to a mirror loss of the cavity, wherein the increase in the mirror loss causes the reduction in the slop efficiency, whilst the decrease in the mirror loss causes the increase in the slop efficiency. In accordance with the present invention, the reflectance factor of the front facet of the cavity is so reduced as to compensate the decrement in the mirror loss upon increases in the length of the cavity, wherein the reflectance factor of the rear facet of the cavity is kept high. Namely, the reflectance factor of the front facet of the cavity is reduced in place of the increase in the length of the cavity in order to prevent any substantive reduction in the mirror loss. The reduction in the reflectance factor of the front facet of the cavity makes it possible for the semiconductor laser with the long cavity length to obtain the mirror loss so high as when the length of the cavity is short.

The front facet has a front reflective film which has a single layered structure having a predetermined thickness and a refractive index which is lower than a refractive index of the cavity. The rear facet has a rear reflective film which has a multi-layered structure, for example, a first rear reflective film in contact with the rear facet and a second reflective film laminated on the first reflective film. The first rear reflective film has a refractive index which is lower than the refractive index of the cavity and has a thickness which is near the thickness of the front refractive film. The second rear reflective film has a refractive index which is higher than the refractive index of the first rear reflective film and near the refractive index of the cavity. The second rear reflective film has a thickness which is thinner than the first refractive index. The reflectance factor of the front facet depends upon the refractive index and the thickness of the front reflective film coated on the front facet. The reflectance factor of the rear facet depends upon the refractive index and the thickness of the rear reflective film coated on the rear facet.

The reduction in the reflectance factor of the front facet of the cavity causes no change in light emission characteristic of the semiconductor laser, for example, no increase in threshold carrier density nor increase in overflow of electrons into a p-type cladding layer as well as no increase in absorption loss.

Further, the cavity of the semiconductor laser is made long, then the current density is reduced, whereby the temperature increase of the semiconductor laser upon the current injection is suppressed.

Consequently, the present invention utilizes the combination of the increase in the length of the cavity with the decreases the reflectance factor of the front facet of the cavity to keep the slope efficiency and the mirror loss, whereby the semiconductor laser or the laser diode shows a high output laser emission at a high slope efficiency.

The above mirror loss of the semiconductor laser or the laser diode is given by the following equation (1).

$$\alpha m=(½L)\times\ln[1/(Rf\times Rr)] \quad (1)$$

where $\alpha_m$ is the mirror loss of the cavity, L is the length of the cavity, Rf is the reflectance factor of a front facet of the cavity, and the Rr is a reflectance factor of a rear facet of the cavity.

If the mirror loss αm and the reflectance factor of the rear facet Rr are fixed, the above equation (1) may be re-written as follows.

$$L=A+B\times\ln(1/Rf) \quad (2)$$

A={1/(2×αm)}ln[1/(Rr)]; and
B=1/(2×αm)
where αm is a mirror loss of the cavity, and said Rr is a reflectance factor of a rear facet of the cavity, and A and B are first and second constants, and L is the length of the cavity, and Rf is a reflectance factor of the front facet of the cavity.

The combination of the length of the cavity with the reflectance factor of the front facet of the cavity is decided by utilizing the above equation (2), provided that the mirror loss αm of the cavity and the reflectance factor Rr of the rear facet of the cavity are previously fixed at desirable high values, so that the high slop efficiency and the low mirror loss are ensured even the cavity length is long, whereby semiconductor laser or the laser diode shows a high output laser emission at a high slope efficiency.

Figure 2:
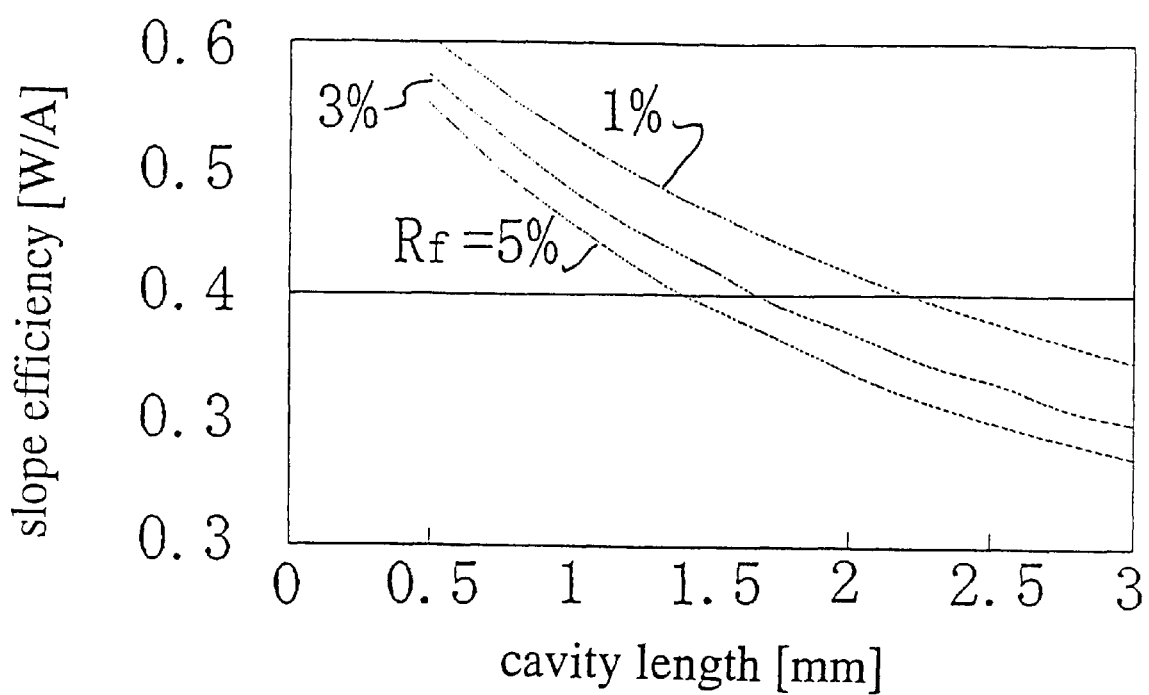
FIG. 2 is a diagram illustrative of variations in slope efficiency over cavity length of a semiconductor laser or a laser diode, wherein the reflectance factor Rf of the front facet is varied to 1%, 3% and 5%, whilst the reflectance factor Rr of the rear facet is fixed at 95%.

FIG. 2 is a diagram illustrative of variations in slope efficiency over cavity length of a semiconductor laser or a laser diode, wherein the reflectance factor Rf of the front facet is varied to 1%, 3% and 5%, whilst the reflectance factor Rr of the rear facet is fixed at 95%. The conventional laser diode designed to emit a light of 1.48 micrometers wavelength has a cavity length of 1.2 millimeters, a front facet reflectance factor Rf of 5%, a rear facet reflectance factor Rr of 95%. The slope efficiency of this conventional laser diode is founded at 0.42 W/A on the basis of FIG. 2. If the front facet reflectance factor $R_f$ and the rear facet reflectance factor Rr are fixed at 5% and 95% respectively and further if the cavity length is increased from 1.2 millimeters, then the slope efficiency is decreased. For example, if, under the above conditions that the front facet reflectance factor Rf and the rear facet reflectance factor Rr are fixed, the cavity length is increased up to 2 millimeters, the slope efficiency is decreased to 0.33 W/A. If, however, in accordance with the present invention, under the different conditions that only the rear facet reflectance factor Rr is fixed, not only the cavity length is increased but also the front facet reflectance factor Rf is decreased, it is possible to prevent the reduction in the slope efficiency of the laser diode. If, for example, the rear facet reflectance factor Rr is fixed at 95% and not only the cavity length is increased up to 2 millimeters but also the front facet reflectance factor Rf is decreased to 1%, then the slope efficiency of the laser diode is suppressed low, for example, at 0.41 W/A which is lower than the above 0.42 W/A of the conventional laser diode. Namely, even the cavity length is increased for having the laser diode respond to the requirement for improvement in the high output characteristic, the reduction in the front facet reflectance factor Rf of the cavity allows keeping the high slope efficiency of the laser diode. As described above, the slope efficiency has a one-to-one correspondence to the mirror loss, wherein the increase in the mirror loss causes the reduction in the slope efficiency, whilst the decrease in the mirror loss causes the increase in the slope efficiency. In accordance with the present invention, the reflectance factor of the front facet of the cavity is so reduced as to compensate the decrement in the mirror loss upon increases in the length of the cavity. The relationships among the mirror loss αm of the cavity, the cavity length, the front facet reflectance factor and the rear facet reflectance factor are given by the above equation (1), for example, αm=(½L)×ln[1/(Rf×Rr)]. If the mirror loss which has the one-to-one correspondence to the required high slope efficiency is set at the desired low value and further if the rear facet reflectance factor Rr is set at high value, then the inter-relationship between the cavity length L and the front facet reflectance factor Rf is given by the above equation (2), for example, L=A+B×ln(1/Rf); A={1/(2×αm)}ln[1/(Rr)]; and B=1/(2×αm).

The combination of the cavity length with the front facet reflectance factor is decided by utilizing the above equation (2), so that the high slop efficiency and the low mirror loss are ensured even the cavity length is long, whereby semiconductor laser or the laser diode shows a high output laser emission at a high slope efficiency.

Figure 3:
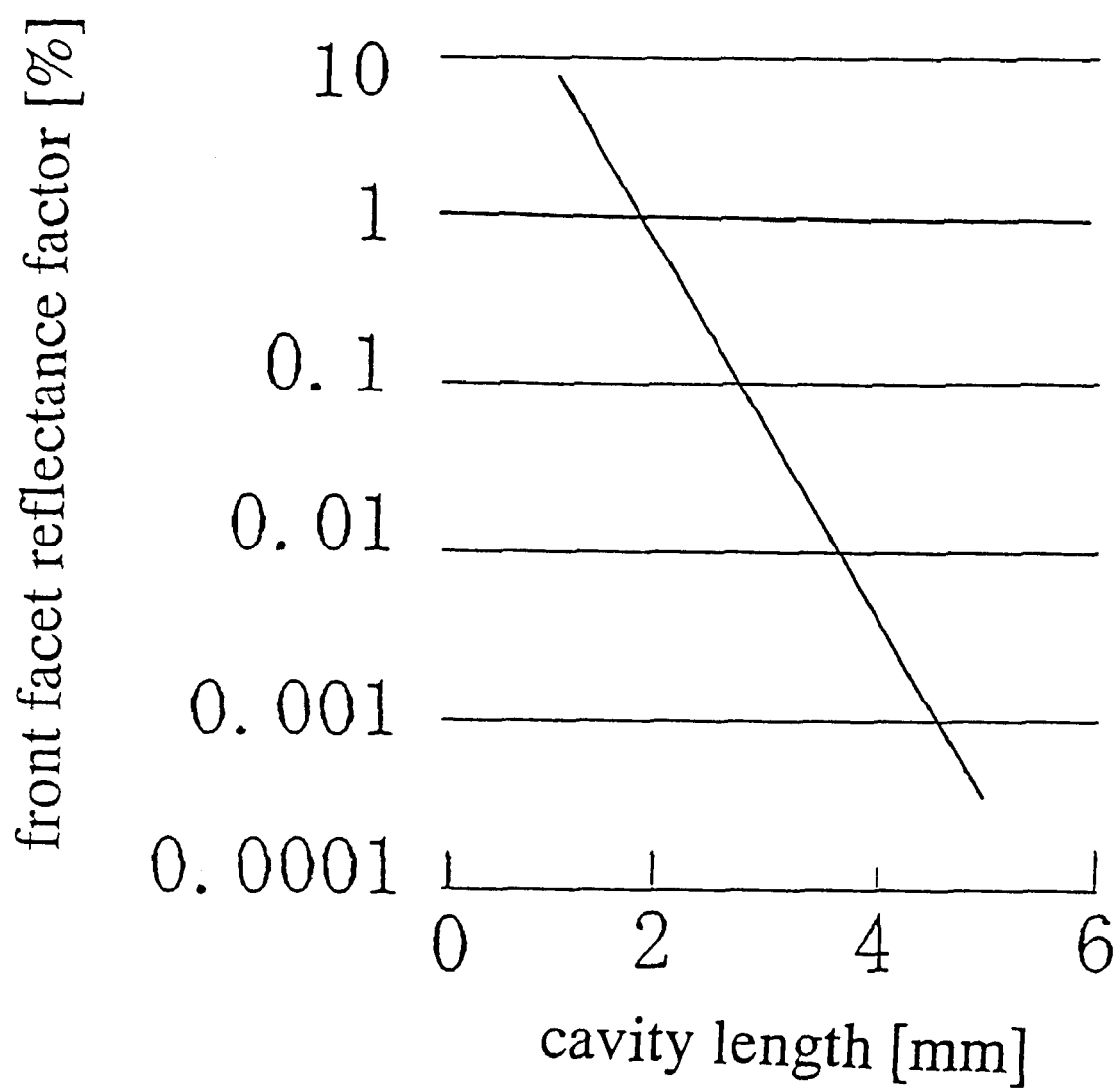
FIG. 3 is a diagram illustrative, in semi-logarithmic scale, of a variation in the front facet reflectance factor Rf of the cavity over the cavity length L, wherein the inter-relationship between the front facet reflectance factor Rf of the cavity over the cavity length L is calculated from the above equation (1) or the equation (2), provided that the rear facet reflectance factor Rr of the cavity is fixed at 95% and the mirror loss αm is fixed at 12.7 $cm^{-1}$.

FIG. 3 is a diagram illustrative, in semi-logarithmic scale, of a variation in the front facet reflectance factor Rf of the cavity over the cavity length L, wherein the inter-relationship between the front facet reflectance factor Rf of the cavity over the cavity length L is calculated from the above equation (1) or the equation (2), provided that the rear facet reflectance factor Rr of the cavity is fixed at 95% and the mirror loss αm is fixed at 12.7 cm$^{-1}$. In FIG. 3, the inter-relationship between the front facet reflectance factor Rf of the cavity over the cavity length L is represented by the straight line in the semi-logarithmic scale. If the combination of the front facet reflectance factor Rf of the cavity over the cavity length L is taken on the straight line in FIG. 3, then the mirror loss is 12.7 cm$^{-1}$. If the combination of the front facet reflectance factor Rf of the cavity over the cavity length L is taken in an upper area bounded by the straight line in FIG. 3, then the mirror loss is higher than 12.7 cm$^{-1}$. If the combination of the front facet reflectance factor Rf of the cavity over the cavity length L is taken in a lower area bounded by the straight line in FIG. 3, then the mirror loss is lower than 12.7 cm$^{-1}$. In this case, the threshold current density remains uniform on the line in FIG. 3 and the laser diode emits the light at the same threshold carrier density. For this reason, the reduction in the reflectance factor of the front facet of the cavity causes no change in light emission characteristic of the laser diode, for example, no increase in threshold carrier density nor increase in overflow of electrons into a p-type cladding layer as well as no increase in absorption loss. Further, the cavity of the semiconductor laser is made long, then the current density is reduced, whereby the temperature increase of the semiconductor laser upon the current injection is suppressed.

Subsequently, the effect of reduction in thermal generation due to increase in the cavity length of the laser diode will theoretically be investigated. The laser device has a thermal resistance Rth. A temperature increment ΔT due to a current injection is given by the following equation (3):

$$\Delta T=RthIV=R_{th}(IVth+IR) \quad (3)$$

where Vth is the internal potential, I is the injection current, R is the device resistance.

The above equation (3) is re-written on the basis of the injection current I with an approximation by use of $Rth^2Vth^2 \ll 4RthR\Delta T$, thereby obtaining the following equation (4):

$$I = [\sqrt{\{\Delta T/(p_t p_r)\}} - (Vth/2p_r)](W/d)L \qquad (4)$$

Where $p_t$ is the thermal resistance, $p_r$ is the device resistance, W is the width of an active layer which forms the cavity or the cavity width, d is the thickness of the active layer which forms the cavity or the cavity thickness. Assuming that $\Delta T$ is the temperature increment at the saturation point and I is the saturation current of the optical output, the saturation current I is proportional to the cavity length L. The above equation (4) is re-written by ignoring the term $(Vth/2\,p_r)$ to represent the temperature increment $\Delta T$ in the following equation (5):

$$\Delta T \approx p_t p_r (d/W)^2 (I/L)^2 \qquad (5)$$

Namely, the temperature increment $\Delta T$ of the laser diode is proportional to the square of the current density (I/L).

In accordance with the above investigation, in order to prevent or suppress the temperature increase of the laser diode upon the current injection, it is necessary to reduce the current density (I/L). In order to reduce the current density (I/L), it is effective to increase the cavity length L.

Subsequently, a predictive equation of the emission characteristic of the laser diode having the increased cavity length will hereinafter be derived. In order to find the actual temperature increase due to the increase in the cavity length of the laser diode, it is necessary to find the temperature increase per a unit current density from the results of the above equation (5), so that an integral of the temperature increase over position of the cavity is calculated thereby to find the total temperature increase over the entire of the laser diode. In consideration of this, the emission characteristic is predicted and the following equation (6) is given.

$$P(I) = Pm((I-Ith)(Lm/L))(L/Lm)(\eta i/\eta dm)\{\alpha m/(\alpha m + \alpha o)\}[\sqrt{(R_r)}/\{\sqrt{(R_f)} + \sqrt{(R_r)}\}][(131\,R_r)/\{1-\sqrt{(R_f R_r)}\}] \qquad (6)$$

where P(I) is the optical output from the front facet of the cavity, Pm(I) is the emission characteristic of the laser diode having a reference cavity length, Lm is the reference cavity length, L is the cavity length, $\eta i$ is the internal differential quantum efficiency, $\eta dm$ is the reference slope efficiency, $\alpha o$ is the internal absorption loss, $\alpha m$ is the mirror loss, and Ith is the threshold injection current.

Figure 4:
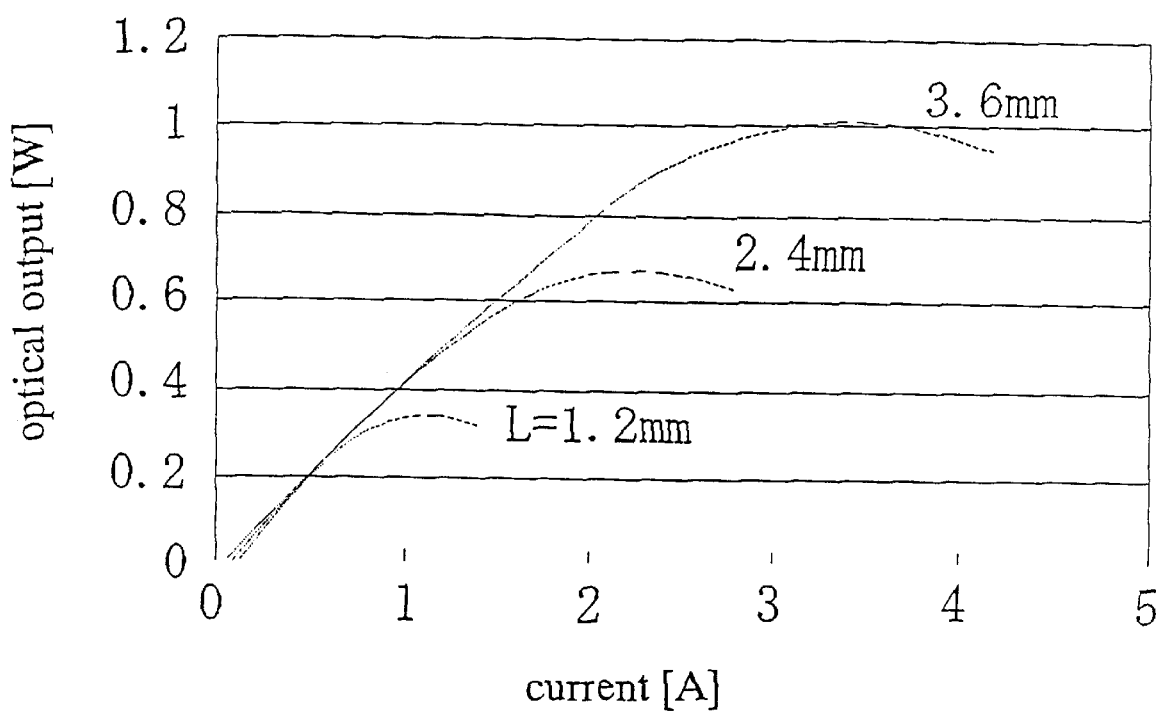
FIG. 4 is a diagram illustrative of variations in optical output of the laser diode over injection current for different cavity lengths of 1.2 mm, 2.4 mm and 3.6 mm, wherein the optical output is calculated from the above equation (6) under the conditions that the front facet reflectance factor Rf is calculated from the above equation (1) wherein the mirror loss αm is set at 12.7 $cm^{-1}$ under the conditions that the cavity length is 1.2 mm, the front facet reflectance factor Rf is 5%, and the rear facet reflectance factor Rr is 95%.

FIG. 4 is a diagram illustrative of variations in optical output of the laser diode over injection current for different cavity lengths of 1.2 mm, 2.4 mm and 3.6 mm, wherein the optical output is calculated from the above equation (6) under the conditions that the front facet reflectance factor $R_f$ is calculated from the above equation (1) wherein the mirror loss $\alpha m$ is set at 12.7 cm$^{-1}$ under the conditions that the cavity length is 1.2 mm, the front facet reflectance factor Rf is 5%, and the rear facet reflectance factor Rr is 95%. When the cavity length is 1.2 mm, the front facet reflectance factor Rf is 5%. When the cavity length is 2.4 mm, the front facet reflectance factor Rf is 0.24%. When the cavity length is 3.6 mm, the front facet reflectance factor Rf is 0.01%. Since not only the cavity length is increased but also the front facet reflectance factor is decreased, then no substantive reduction in the slope efficiency appears, whereby the laser diode having the increased cavity length emits the light at the high output and the high slope efficiency.

Figure 5:
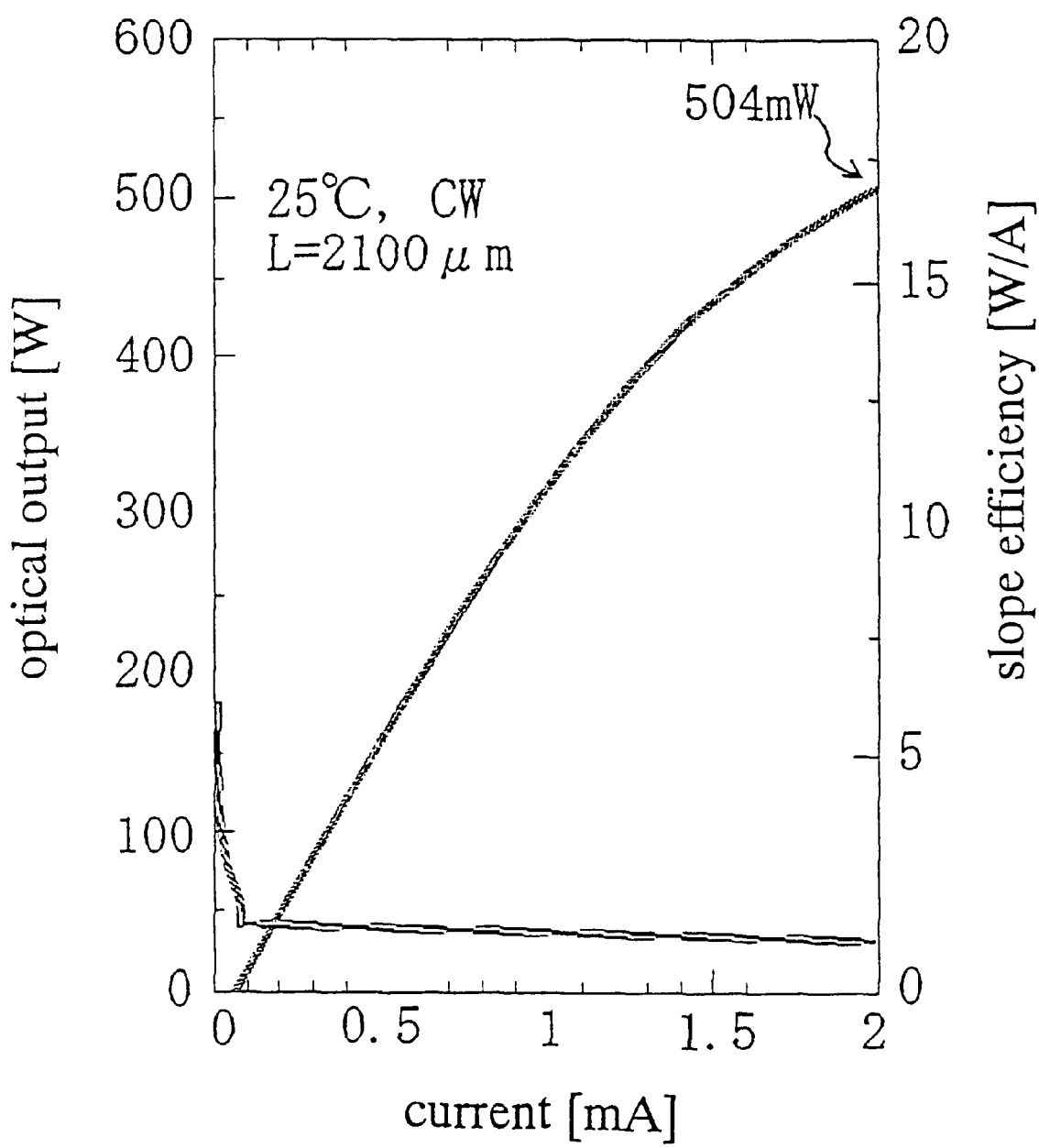
FIG. 5 is a diagram illustrative of emission characteristics of the laser diode, for example, variations in optical output over injection current under the conditions that the cavity length is 2.1 mm, the front facet reflectance factor Rf is 1%, the rear facet reflectance factor Rr is 95%, so that the mirror loss is set at 11.1 $cm^{-1}$ even the upper limit of the mirror loss is 13 $cm^{-1}$, thereby providing a small acceptable margin in the front facet reflectance factor Rf against the upper limit of the mirror loss is 13 $cm^{-1}$.

FIG. 5 is a diagram illustrative of emission characteristics of the laser diode, for example, variations in optical output over injection current under the conditions that the cavity length is 2.1 mm, the front facet reflectance factor Rf is 1%, the rear facet reflectance factor Rr is 95%, so that the mirror loss is set at 11.1 cm$^{-1}$ even the upper limit of the mirror loss is 13 cm$^{-1}$, thereby providing a small acceptable margin in the front facet reflectance factor Rf against the upper limit of the mirror loss is 13 cm$^{-1}$. The maximum output is 504 mW at a temperature of 25° C. The slope efficiency is high, for example, 0.39 W/A. The increase in the cavity length improves the thermal radiation characteristic, whereby the high output characteristic is realized.

PREFERRED EMBODIMENT

Figure 6:
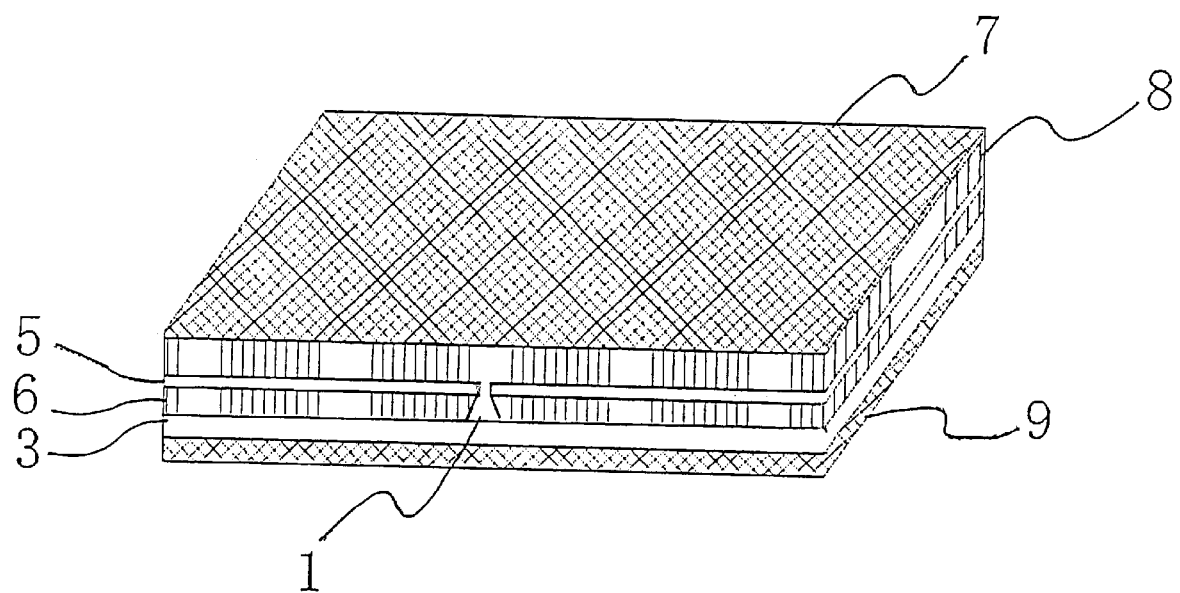
FIG. 6 is a schematic perspective view illustrative of a semiconductor laser having an improved cavity, to which the above present invention is applied, in a first embodiment in accordance with the present invention. The semiconductor laser has a TiAu n-electrode 9.

A first embodiment according to the present invention will be described in detail with reference to the drawings. FIG. 6 is a schematic perspective view illustrative of a semiconductor laser having an improved cavity, to which the above present invention is applied, in a first embodiment in accordance with the present invention. The semiconductor laser has a TiAu n-electrode 9. An n-InP semiconductor substrate 3 is provided on the TiAu n-electrode 9. A p-InP current block layer 6 is provided on the n-InP semiconductor substrate 3. An n-InP current block layer 5 is provided on the p-InP current block layer 6. A p-InP cladding layer 8 is provided on the n-InP current block layer 5. A TiAu p-electrode 7 is provided on the p-InP cladding layer 8. A multiple quantum well layer 1 is provided in the p-InP current block layer 6, wherein the multiple quantum well layer 1 has a mesa shape in cross section and extends in a first direction perpendicular to a second direction along which the above laminated structure is cleaved to form first and second facets, whereby the multiple quantum well layer 1 also has first and second facets. The multiple quantum well layer 1 is leveled to the p-InP current block layer 6, so that distances of the multiple quantum well layer 1 from the TiAu n-electrode 9 and from the TiAu p-electrode 7 are the same as distances of the p-InP current block layer 6 from the TiAu n-electrode 9 and from the TiAu p-electrode 7. The n-InP current block layer 5 extends on the p-InP current block layer 6 but does not extends over the multiple quantum well layer 1. The p-InP cladding layer 8 extends not only on the n-InP current block layer 5 but also over the multiple quantum well layer 1. Further, even illustration is omitted, laminations of an n-InP cladding layer and a first InGaAsP separate confinement hetero-structure layer are interposed between a bottom of the multiple quantum well layer 1 and the n-InP semiconductor substrate 3, wherein the n-InP cladding layer is in contact with the n-InP semiconductor substrate 3 and the first InGaAsP separate confinement hetero-structure layer is in contact with the bottom of the multiple quantum well layer 1. The bottom of the multiple quantum well layer 1 is connected through the first InGaAsP separate confinement hetero-structure layer to the n-InP cladding layer which is further connected through the n-InP semiconductor substrate 3 to the TiAu n-electrode 9. Furthermore, even illustration is omitted, laminations of a second InGaAsP separate confinement hetero-structure layer and a p-InP cladding layer are interposed between a top of the mesa-shaped multiple quantum well layer 1 and the p-InP cladding layer 8, wherein the p-InP cladding layer is in contact with the p-InP cladding layer 8 and the second InGaAsP separate confinement hetero-structure layer is in contact with the top of the mesa-shaped multiple quantum well layer 1. The top of the mesa-shaped multiple quantum well layer 1 is connected through the second InGaAsP separate confinement hetero-structure layer to the p-InP cladding layer which is further connected through the p-InP cladding layer 8 to the TiAu p-electrode 7. Even illustration is omitted, the front facet has a front reflective film which has a single layered structure having a thickness of 2000 angstroms and a refractive index of 1.8. A refractive index of the cavity is about 3.6. The rear facet has a rear reflective film which has a multi-layered structure, for example, a first rear reflective film in contact with the rear facet and a second reflective film laminated on the first reflective film. The first rear reflective film has a refractive index of 1.5 and has a thickness of 0.2 micrometers. The second rear reflective film has a refractive index of 3.6 and has a thickness of 0.1 micrometers. The reflectance factor of the front facet depends upon the refractive index and the thickness of the front reflective film coated on the front facet. The reflectance factor of the rear facet depends upon the refractive index and the thickness of the rear reflective film coated on the rear facet. As a result, the above semiconductor laser forms a laser diode.

The above laminated structure sandwiched between the n-electrode 9 and the p-electrode 7 is cleaved to form first and second facets which are distanced from each other in the first direction, along which the mesa-shaped multiple quantum well layer 1 extends. The mesa-shaped multiple quantum well layer 1 serves as a cavity. The first and second facets have first and second coating films, so that the mesa-shaped multiple quantum well layer 1 also has first and second facets which further have first and second coating films. The cavity length is defined to be a distance between the first and second facets distanced in the first direction of the mesa-shaped multiple quantum well layer 1. A first reflectance factor of the first facet is low whilst a second first reflectance factor of the first facet is high so that a light is emitted from the first facet. The first facet will hereinafter be referred to as a front facet. The second facet will hereinafter be referred to as a rear facet. The first coating film on the front facet will hereinafter be referred to as a front coating film. The second coating film on the rear facet will hereinafter be referred to as a rear coating film. In accordance with the present invention, the cavity length is set not less than 1.5 millimeters, preferably and not less than 2 millimeters, and the front coating film on the front facet is so provided that a reflectance factor of the front facet of the mesa-shaped multiple quantum well layer 1 serving as the cavity is not more than 2%, preferably not more than 1%.

The above semiconductor laser may be fabricated by the following processes. FIGS. 7A through 7E are perspective views illustrative of semiconductor lasers in sequential steps involved in a novel fabrication method in a first embodiment in accordance with the present invention.

Figure 7A:
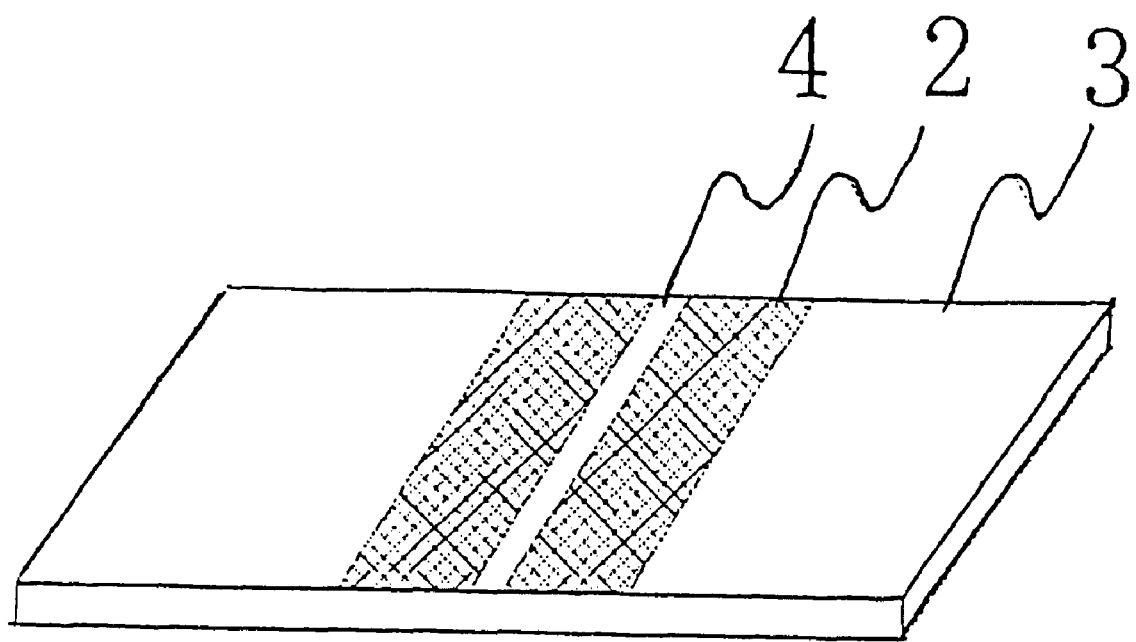
FIGS. 7A through 7E are perspective views illustrative of semiconductor lasers in sequential steps involved in a novel fabrication method in a first embodiment in accordance with the present invention.

With reference to FIG. 7A, an $SiO_2$ growth-stopper layer 2 having a thickness of 100 nanometers is entirely deposited on a (001)-face of an n-InP substrate 3 by a thermal chemical vapor deposition method. A resist film is entirely applied on the $SiO_2$ growth-stopper layer 2. A lithography process is carried out to form a resist pattern on the $SiO_2$ growth-stopper layer 2. A selective wet-etching to the on the $SiO_2$ growth-stopper layer 2 is carried out by use of a diluted fluorine acid solution and the resist pattern, so that two stripe-shaped $SiO_2$ growth-stopper layers 2 are formed on the n-InP substrate 3. Each of the two stripe-shaped $SiO_2$ growth-stopper layers 2 has a width of 5 micrometers. The two stripe-shaped $SiO_2$ growth-stopper layers 2 are distanced from each other by a stripe-shape gap region 4 having a gap width 3 micrometers.

Figure 7B:
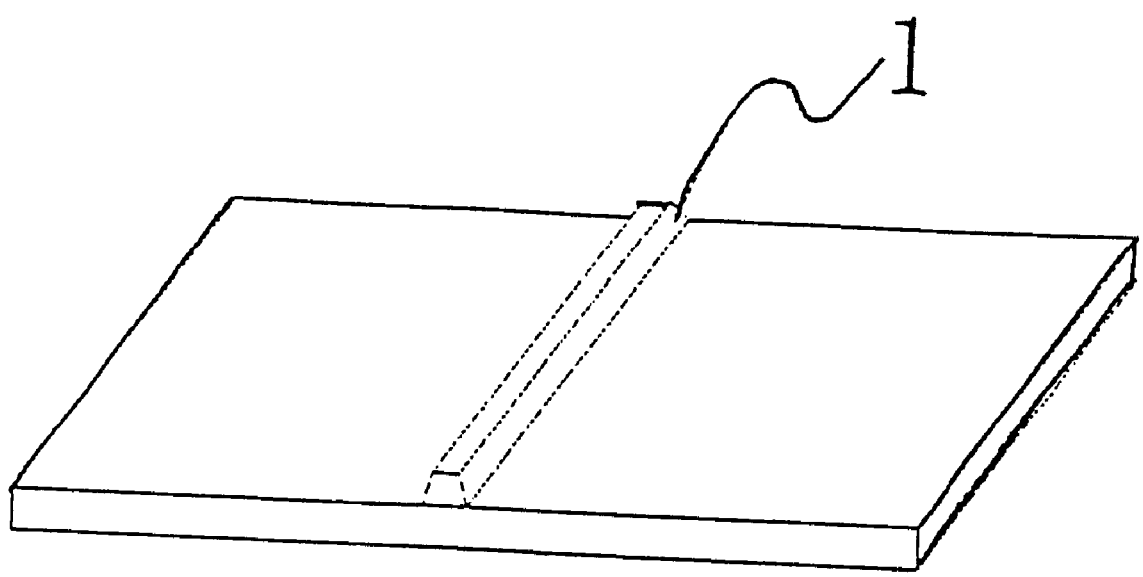

With reference to FIG. 7B, a selective metal organic vapor phase epitaxy is carried out by use of the two stripe-shaped $SiO_2$ growth-stopper layers 2 so that an n-InP cladding layer having a thickness of 100 nanometers is selectively and epitaxially grown on the stripe-shape gap region 4 sandwiched between the two stripe-shaped $SiO_2$ growth-stopper layers 2. Further, a first InGaAsP separate confinement hetero-structure layer having a 1.2 micrometers-wavelength composition and a thickness of 30 nanometers is selectively and epitaxially grown on the n-InP cladding layer and over the stripe-shape gap region 4 sandwiched between the two stripe-shaped $SiO_2$ growth-stopper layers 2 by the sequential selective metal organic vapor phase epitaxy. Furthermore, a multiple quantum well layer 1 is selectively and epitaxially grown on the first InGaAsP separate confinement hetero-structure layer and over the stripe-shape gap region 4 sandwiched between the two stripe-shaped $SiO_2$ growth-stopper layers 2 by the sequential selective metal organic vapor phase epitaxy, wherein the multiple quantum well layer 1 comprises alternating laminations of three InGaAsP well layers having a 1.5 micrometers-wavelength composition and a thickness of 4 nanometers and two InGaAsP potential barrier layers having a 1.2 micrometers-wavelength composition and a thickness of 10 nanometers, so that an emission wavelength is 1.48 micrometers. Moreover, a second InGaAsP separate confinement hetero-structure layer having a 1.2 micrometers-wavelength composition and a thickness of 30 nanometers is selectively and epitaxially grown on the multiple quantum well layer and over the stripe-shape gap region 4 sandwiched between the two stripe-shaped $SiO_2$ growth-stopper layers 2 by the sequential selective metal organic vapor phase epitaxy. Still further, a p-InP cladding layer having a thickness of 100 nanometers is selectively and epitaxially grown on the second InGaAsP separate confinement hetero-structure layer and over the stripe-shape gap region 4 sandwiched between the two stripe-shaped $SiO_2$ growth-stopper layers 2 by the sequential selective metal organic vapor phase epitaxy. The above laminations of the n-InP cladding layer, the first InGaAsP separate confinement hetero-structure layer, the multiple quantum well layer 1, the second InGaAsP separate confinement hetero-structure layer, and the p-InP cladding layer are formed in mesa-shape on the stripe-shape gap region 4 sandwiched between the two stripe-shaped $SiO_2$ growth-stopper layers 2. The above mesa serves as a waveguide. The used two stripe-shaped $SiO_2$ growth-stopper layers 2 are then removed by a fluorine acid solution.

Figure 7C:
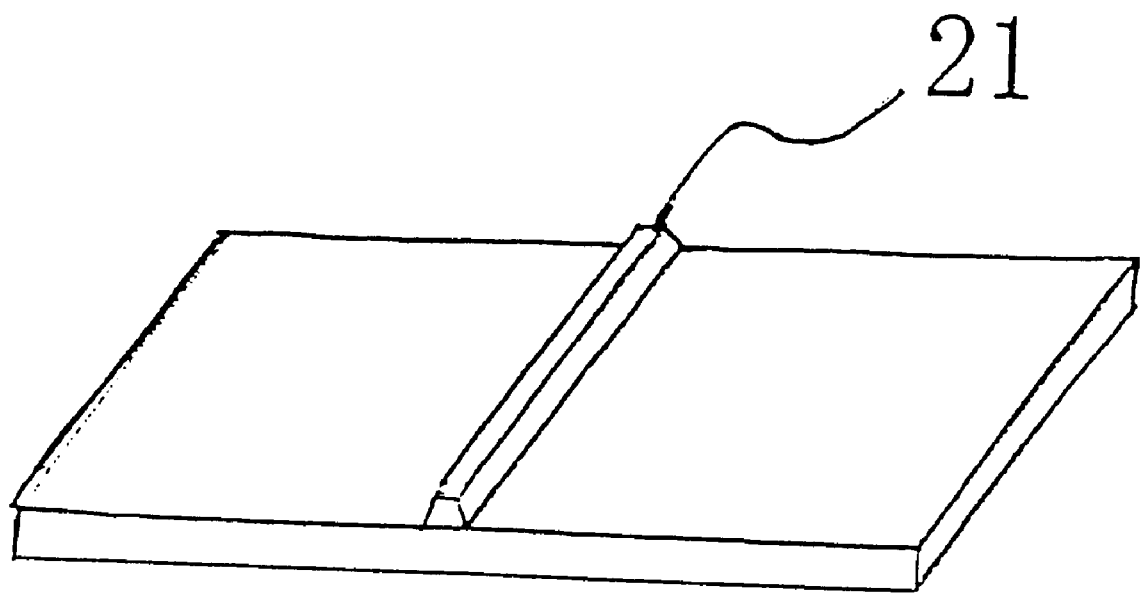

With reference to FIG. 7C, an $SiO_2$ growth-stopper layer 21 is entirely formed over the mesa having the multiple quantum well layer 1 and over the n-InP substrate 3. The $SiO_2$ growth-stopper layer 21 is then selectively etched in a self-alignment process and by use of a fluorine acid solution, so that the $SiO_2$ growth-stopper layer 21 remains only on a top surface of the mesa having the multiple quantum well layer 1, whereby sloped side walls of the mesa having the multiple quantum well layer 1 and the top surfaces of the n-InP substrate 3 are shown.

Figure 7D:
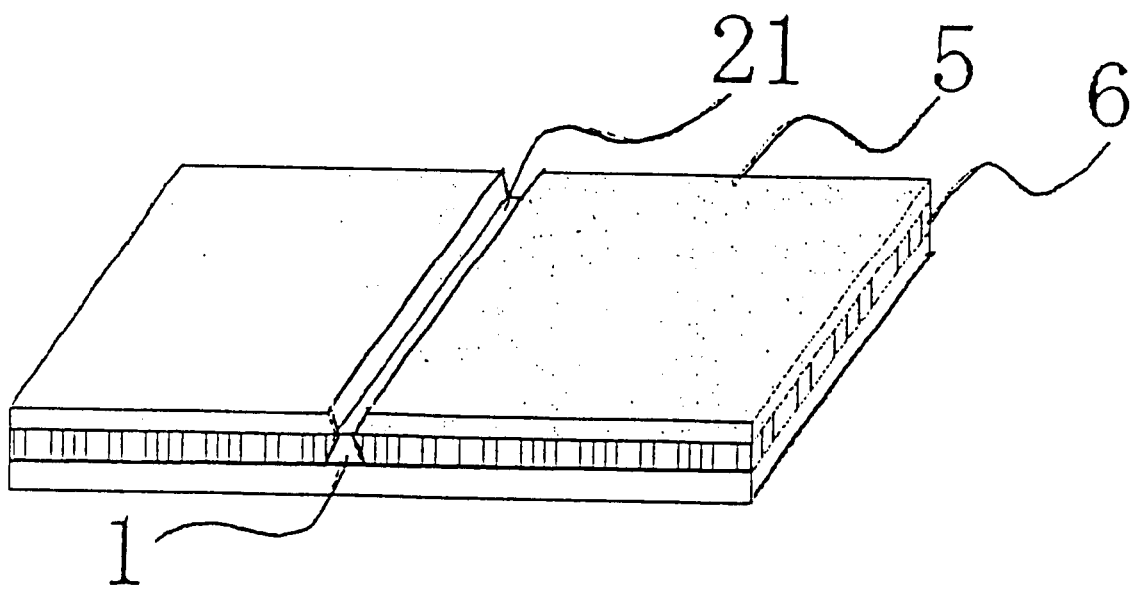

With reference to FIG. 7D, a selective metal organic vapor phase epitaxy is carried out by use of the $SiO_2$ growth-stopper layer 21 as a mask a p-InP current block layer 6 is selectively and epitaxially grown on the top surfaces of the n-InP substrate 3 except on the $SiO_2$ growth-stopper layer 21 and except over the mesa, wherein the p-InP current block layer 6 has a thickness of 0.7 micrometers, whereby a top surface of the p-InP current block layer 6 is substantially leveled to the top surface of the mesa. Further, n-InP current block layers 5 are selectively and epitaxially grown by the sequential selective metal organic vapor phase epitaxy on the top surfaces of the p-InP current block layer 6 except on the $SiO_2$ growth-stopper layer 21 and except over the mesa, wherein the n-InP current block layers 5 have a thickness of 0.7 micrometers. A groove is formed over the SiO₂ growth-stopper layer 21, and the n-InP current block layers 5 are separated from each other by the groove.

Figure 7E:
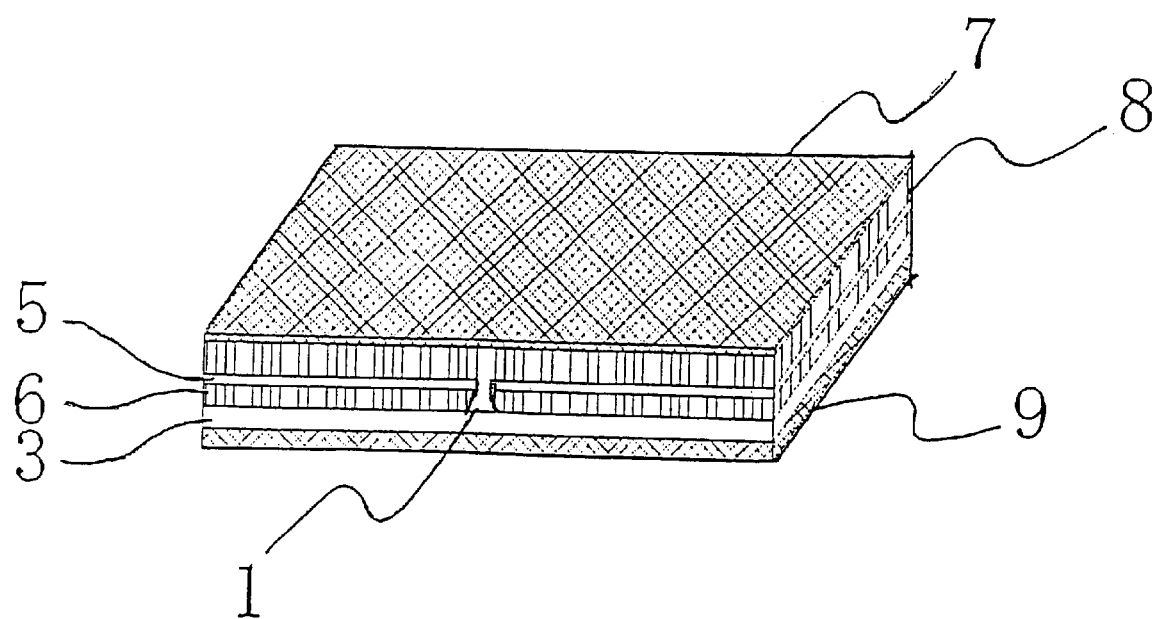

With reference to FIG. 7E, the used SiO₂ growth-stopper layer 21 is removed. A p-InP cladding layer 8 is entirely formed so that the p-InP cladding layer 8 extends in the groove separating the n-InP current block layers 5 and extends on the top surfaces of the n-InP current block layers 5. The p-InP cladding layer 8 has a thickness of 5 nanometers which is thicker than that of the usual one so that a part of the optical field does not reach the electrode. A TiAu p-electrode 7 is formed on the top surface of the p-InP cladding layer 8 and further a TiAu n-electrode 9 is formed on the bottom surface of the n-lnP substrate 3. A heat treatment is carried out at a temperature of 430° C. so that an alloy of TiAu is formed. Even illustration is omitted, the front facet has a front reflective film which has a single layered structure having a thickness of 2000 angstroms and a refractive index of 1.8. A refractive index of the cavity is about 3.6. Further, the above laminated structure is cleaved to form front and rear facets. The cavity length is defined to be a distance between the front and rear facets. A front reflective film is formed on the front facet, wherein the front reflective film has a single layered structure having a thickness of 2000 angstroms and a refractive index of 1.8. A refractive index of the cavity is about 3.6. A rear reflective film is formed on the rear facet, wherein the rear reflective film has a multi-layered structure, for example, a first rear reflective film in contact with the rear facet and a second reflective film laminated on the first reflective film. The first rear reflective film has a refractive index of 1.5 and has a thickness of 0.2 micrometers. The second rear reflective film has a refractive index of 3.6 and has a thickness of 0.1 micrometers. The reflectance factor of the front facet depends upon the refractive index and the thickness of the front reflective film coated on the front facet. The reflectance factor of the rear facet depends upon the refractive index and the thickness of the rear reflective film coated on the rear facet.

The above laminated structure sandwiched between the n-electrode 9 and the p-electrode 7 is cleaved to form first and second facets which are distanced from each other in the first direction, along which the mesa-shaped multiple quantum well layer 1 extends. The mesa-shaped multiple quantum well layer 1 serves as a cavity. The first and second facets have first and second coating films, so that the mesa-shaped multiple quantum well layer 1 also has first and second facets which further so have first and second coating films. The cavity length is defined to be a distance between the first and second facets distanced in the first direction of the mesa-shaped multiple quantum well layer 1. A first reflectance factor of the first facet is low whilst a second first reflectance factor of the first facet is high so that a light is emitted from the first facet. The first facet will hereinafter be referred to as a front facet. The second facet will hereinafter be referred to as a rear facet. The first coating film on the front facet will hereinafter be referred to as a front coating film. The second coating film on the rear facet will hereinafter be referred to as a rear coating film. In accordance with the present invention, the cavity length is set not less than 1.5 millimeters, preferably and not less than 2 millimeters, and the front coating film on the front facet is so provided that a reflectance factor of the front facet of the mesa-shaped multiple quantum well layer 1 serving as the cavity is not more than 2%, preferably not more than 1%.

In accordance with the above embodiment, the cavity of the semiconductor laser or the laser diode is so designed to avoid any substantive reduction in the slope efficiency of the semiconductor laser or the laser diode, even the length of the cavity is increased. The slope efficiency depends upon both the length of the cavity and reflectance factors of front and rear facets of the cavity. The light is emitted from the front facet of the cavity. If the length of the cavity is increased and if the reflectance factors of front and rear facets of the cavity are fixed, then the slope efficiency is reduced. If the length of the cavity is fixed and if the reflectance factor of the rear facet of the cavity is fixed and further if the reflectance factor of the front facet of the cavity is reduced, then the slope efficiency is increased. In accordance with the present invention, the reflectance factor of the front facet of the cavity is so reduced as to compensate the increment in the slope efficiency upon increases in the length of the cavity, wherein the reflectance factor of the rear facet of the cavity is kept high. Namely, the reflectance factor of the front facet of the cavity is reduced in place of the increase in the length of the cavity in order to prevent any substantive reduction in the slope efficiency. The reduction in the reflectance factor of the front facet of the cavity makes it possible for the semiconductor laser with the long cavity length to obtain the slope efficiency so high as when the length of the cavity is short. The slope efficiency has a one-to-one correspondence to a mirror loss of the cavity, wherein the increase in the mirror loss causes the reduction in the slop efficiency, whilst the decrease in the mirror loss causes the increase in the slop efficiency. In accordance with the present invention, the reflectance factor of the front facet of the cavity is so reduced as to compensate the decrement in the mirror loss upon increases in the length of the cavity, wherein the reflectance factor of the rear facet of the cavity is kept high. Namely, the reflectance factor of the front facet of the cavity is reduced in place of the increase in the length of the cavity in order to prevent any substantive reduction in the mirror loss. The reduction in the reflectance factor of the front facet of the cavity makes it possible for the semiconductor laser with the long cavity length to obtain the mirror loss so high as when the length of the cavity is short.

The reduction in the reflectance factor of the front facet of the cavity causes no change in light emission characteristic of the semiconductor laser, for example, no increase in threshold carrier density nor increase in overflow of electrons into a p-type cladding layer as well as no increase in absorption loss.

Further, the cavity of the semiconductor laser is made long, then the current density is reduced, whereby the temperature increase of the semiconductor laser upon the current injection is suppressed.

Consequently, the present invention utilizes the combination of the increase in the length of the cavity with the decreases the reflectance factor of the front facet of the cavity to keep the slope efficiency and the mirror loss, whereby the semiconductor laser or the laser diode shows a high output laser emission at a high slope efficiency.

The above mirror loss of the semiconductor laser or the laser diode is given by the following equation (1).

$$\alpha m = (\tfrac{1}{2}L) \times \ln[1/(Rf \times Rr)] \quad (1)$$

where αm is the mirror loss of the cavity, L is the length of the cavity, Rf is the reflectance factor of a front facet of the cavity, and the Rr is a reflectance factor of a rear facet of the cavity.

If the mirror loss a m and the reflectance factor of the rear facet Rr are fixed, the above equation (1) may be re-written as follows.

$$L = A + B \times \ln(1/Rf) \qquad (2)$$

$A = \{1/(2 \times \alpha m)\} \ln[1/(Rr)];$ and
$B = 1/(2 \times \alpha m)$
where $\alpha m$ is a mirror loss of the cavity, and said Rr is a reflectance factor of a rear facet of the cavity, and A and B are first and second constants, and L is the length of the cavity, and Rf is a reflectance factor of the front facet of the cavity.

The combination of the length of the cavity with the reflectance factor of the front facet of the cavity is decided by utilizing the above equation (2), provided that the mirror loss $\alpha m$ of the cavity and the reflectance factor Rr of the rear facet of the cavity are previously fixed at desirable high values, so that the high slop efficiency and the low mirror loss are ensured even the cavity length is long, whereby semiconductor laser or the laser diode shows a high output laser emission at a high slope efficiency.

With reference to FIG. 2, variations in slope efficiency over cavity length of a semiconductor laser or a laser diode are shown, wherein the reflectance factor Rf of the front facet is varied to 1%, 3% and 5%, whilst the reflectance factor Rr of the rear facet is fixed at 95%. The conventional laser diode designed to emit a light of 1.48 micrometers wavelength has a cavity length of 1.2 millimeters, a front facet reflectance factor Rf of 5%, a rear facet reflectance factor Rr of 95%. The slope efficiency of this conventional laser diode is founded at 0.42 W/A on the basis of FIG. 2. If the front facet reflectance factor Rf and the rear facet reflectance factor Rr are fixed at 5% and 95% respectively and further if the cavity length is increased from 1.2 millimeters, then the slope efficiency is decreased. For example, if, under the above conditions that the front facet reflectance factor Rf and the rear facet reflectance factor Rr are fixed, the cavity length is increased up to 2 millimeters, the slope efficiency is decreased to 0.33 W/A. If, however, in accordance with the present invention, under the different conditions that only the rear facet reflectance factor Rr is fixed, not only the cavity length is increased but also the front facet reflectance factor Rf is decreased, it is possible to prevent the reduction in the slope efficiency of the laser diode. If, for example, the rear facet reflectance factor Rr is fixed at 95% and not only the cavity length is increased up to 2 millimeters but also the front facet reflectance factor Rf is decreased to 1%, then the slope efficiency of the laser diode is suppressed low, for example, at 0.41 W/A which is lower than the above 0.42 W/A of the conventional laser diode. Namely, even the cavity length is increased for having the laser diode respond to the requirement for improvement in the high output characteristic, the reduction in the front facet reflectance factor Rf of the cavity allows keeping the high slope efficiency of the laser diode. As described above, the slope efficiency has a one-to-one correspondence to the mirror loss, wherein the increase in the mirror loss causes the reduction in the slope efficiency, whilst the decrease in the mirror loss causes the increase in the slope efficiency. In accordance with the present invention, the reflectance factor of the front facet of the cavity is so reduced as to compensate the decrement in the mirror loss upon increases in the length of the cavity. The relationships among the mirror loss $\alpha m$ of the cavity, the cavity length, the front facet reflectance factor and the rear facet reflectance factor are given by the above equation (1), for example, $\alpha m = (\frac{1}{2}L) \times \ln[1/(Rf \times Rr)]$. If the mirror loss which has the one-to-one correspondence to the required high slope efficiency is set at the desired low value and further if the rear facet reflectance factor Rr is set at high value, then the inter-relationship between the cavity length L and the front facet reflectance factor Rf is given by the above equation (2), for example, $L = A + B \times \ln(1/Rf)$; $A = \{1/(2 \times \alpha m)\} \ln[1/(Rr)]$; and $B = 1/(2 \times \alpha m)$.

The combination of the cavity length with the front facet reflectance factor is decided by utilizing the above equation (2), so that the high slop efficiency and the low mirror loss are ensured even the cavity length is long, whereby semiconductor laser or the laser diode shows a high output laser emission at a high slope efficiency.

With reference to FIG. 3 a variation in the front facet reflectance factor Rf of the cavity over the cavity length L is illustrated, wherein the inter-relationship between the front facet reflectance factor Rf of the cavity over the cavity length L is calculated from the above equation (1) or the equation (2), provided that the rear facet reflectance factor Rr of the cavity is fixed at 95% and the mirror loss a in is fixed at 12.7 cm$^{-1}$. In FIG. 3, the inter-relationship between the front facet reflectance factor Rf of the cavity over the cavity length L is represented by the straight line in the semi-logarithmic scale. If the combination of the front facet reflectance factor Rf of the cavity over the cavity length L is taken on the straight line in FIG. 3, then the mirror loss is 12.7 cm$^{-1}$. If the combination of the front facet reflectance factor Rf of the cavity over the cavity length L is taken in an upper area bounded by the straight line in FIG. 3, then the mirror loss is higher than 12.7 cm$^{-1}$. If the combination of the front facet reflectance factor Rf of the cavity over the cavity length L is taken in a lower area bounded by the straight line in FIG. 3, then the mirror loss is lower than 12.7 cm$^{-1}$. In this case, the threshold current density remains uniform on the line in FIG. 3 and the laser diode emits the light at the same threshold carrier density. For this reason, the reduction in the reflectance factor of the front facet of the cavity causes no change in light emission characteristic of the laser diode, for example, no increase in threshold carrier density nor increase in overflow of electrons into a p-type cladding layer as well as no increase in absorption loss. Further, the cavity of the semiconductor laser is made long, then the current density is reduced, whereby the temperature increase of the semiconductor laser upon the current injection is suppressed.

Subsequently, the effect of reduction in thermal generation due to increase in the cavity length of the laser diode will theoretically be investigated. The laser device has a thermal resistance Rth. A temperature increment $\Delta T$ due to a current injection is given by the following equation (3):

$$\Delta T = Rth I V = R_{th}(IVth + IR) \qquad (3)$$

where $V_{th}$ is the internal potential, I is the injection current, R is the device resistance.

The above equation (3) is re-written on the basis of the injection current I with an approximation by use of $Rth^2 Vth^2 << 4 Rth R \Delta T$, thereby obtaining the following equation (4):

$$I = [\sqrt{\{\Delta T/(p_t p_r)\}} - (Vth/2\, p_r)](W/d)L \qquad (4)$$

Where $p_t$ is the thermal resistance, $p_r$ is the device resistance, W is the width of an active layer which forms the cavity or the cavity width, d is the thickness of the active layer which forms the cavity or the cavity thickness. Assuming that $\Delta T$ is the temperature increment at the saturation point and I is the saturation current of the optical output, the saturation current I is proportional to the cavity length L. The above equation (4) is re-written by ignoring the term $(V_{th}/2\,p_r)$ to represent the temperature increment $\Delta T$ in the following equation (5):

$$\Delta T \approx p_t p_r (d/W)^2 (I/L)^2 \qquad (5)$$

Namely, the temperature increment $\Delta T$ of the laser diode is proportional to the square of the current density (I/L).

In accordance with the above investigation, in order to prevent or suppress the temperature increase of the laser diode upon the current injection, it is necessary to reduce the current density (I/L). In order to reduce the current density (I/L), it is effective to increase the cavity length L.

Subsequently, a predictive equation of the emission characteristic of the laser diode having the increased cavity length will hereinafter be derived. In order to find the actual temperature increase due to the increase in the cavity length of the laser diode, it is necessary to find the temperature increase per a unit current density from the results of the above equation (5), so that an integral of the temperature increase over position of the cavity is calculated thereby to find the total temperature increase over the entire of the laser diode. In consideration of this, the emission characteristic is predicted and the following equation (6) is given.

$$P(I)=Pm((I-Ith)(Lm/L))(L/Lm)(\eta i/\eta dm)\{\alpha m/(\alpha m+\alpha o)\}[\sqrt{(R_r)}/\{\sqrt{(R_f)}+\sqrt{(R_r)}\}][(1-R_r)/\{1-\sqrt{(R_f R_r)}\}] \qquad (6)$$

where P(I) is the optical output from the front facet of the cavity, Pm(I) is the emission characteristic of the laser diode having a reference cavity length, Lm is the reference cavity length, L is the cavity length, $\eta i$ is the internal differential quantum efficiency, $\eta dm$ is the reference slope efficiency, $\alpha o$ is the internal absorption loss, $\alpha m$ is the mirror loss, and Ith is the threshold injection current.

With reference to FIG. 4, the optical output is calculated from the above equation (6) under the conditions that the front facet reflectance factor Rf is calculated from the above equation (1) wherein the mirror loss $\alpha m$ is set at 12.7 cm$^{-1}$ under the conditions that the cavity length is 1.2 mm, the front facet reflectance factor Rf is 5%, and the rear facet reflectance factor Rr is 95%. When the cavity length is 1.2 mm, the front facet reflectance factor Rf is 5%. When the cavity length is 2.4 mm, the front facet reflectance factor Rf is 0.24%. When the cavity length is 3.6 mm, the front facet reflectance factor Rf is 0.01%. Since not only the cavity length is increased but also the front facet reflectance factor is decreased, then no substantive reduction in the slope efficiency appears, whereby the laser diode having the increased cavity length emits the light at the high output and the high slope efficiency.

With reference to FIG. 5, emission characteristics of the laser diode, for example, variations in optical output over injection current are illustrated under the conditions that the cavity length is 2.1 mm, the front facet reflectance factor Rf is 1%, the rear facet reflectance factor Rr is 95%, so that the mirror loss is set at 11.1 cm$^{-1}$ even the upper limit of the mirror loss is 13 cm$^{-1}$, thereby providing a small acceptable margin in the front facet reflectance factor Rf against the upper limit of the mirror loss is 13 cm$^{-1}$. The maximum output is 504 mW at a temperature of 25° C. The slope efficiency is high, for example, 0.39 W/A. The increase in the cavity length improves the thermal radiation characteristic, whereby the high output characteristic is realized.

The above present invention is applicable not only the semiconductor laser described in the above first embodiment but also the other semiconductor laser to be described in the following first modification to the above first embodiment.

In the above first embodiment, the multiple quantum well layer 1 is grown by the selective metal organic vapor phase epitaxy to form the mesa-shaped multiple quantum well layer 1. It is, however, possible to that the multiple quantum well layer 1 is entirely formed over the n-InP substrate 3 before the multiple quantum well layer 1 is selectively etched by a wet etching or a dry etching by use of two stripe-shaped SiO$_2$ masks to form a mesa-shaped waveguide having a multiple quantum well layer 1 on a stripe-shaped gap region defined between the two stripe-shaped SiO$_2$ masks. These two stripe-shaped SiO$_2$ masks are further used as growth-stoppers to carry out the selective metal organic vapor phase epitaxy to form a p-type current block layer and an n-type current block layer sequentially over the mesa-shaped waveguide. The used two stripe-shaped SiO$_2$ masks having served as the growth-stoppers are then removed. A p-InP cladding layer 8 is formed by the metal organic vapor phase epitaxy in the same manner as described in the first embodiment. Further, the p-electrode 7 and the n-electrode 9 are also formed in the same manner as described in the first embodiment. In place of the metal organic vapor phase epitaxy, it is alternatively possible to carry out a low pressure epitaxy to form the p-type current block layer and the n-type current block layer sequentially over the mesa-shaped waveguide, and further form the p-InP cladding layer 8.

The above present invention is also applicable not only the semiconductor lasers described in the above first embodiment and the first modification but also the other semiconductor laser to be described in the following second modification to the above first embodiment.

In the first embodiment and the first modification thereto, the p-type and n-type current block layers and the p-InP cladding layer 8 are formed by the metal organic vapor phase epitaxy. In this second modification, the low pressure epitaxy is carried out one time to form the p-type and n-type current block layers and the p-InP cladding layer 8, whereby a double channel-planar buried hetero-structure. The multiple quantum well layer 1 is entirely formed over the n-InP substrate 3. A resist pattern is formed on the multiple quantum well layer 1, wherein the resist pattern has a pair of stripe-shaped openings. Each of the paired stripe-shaped openings has a width of 2 micrometers, and the paired stripe-shaped openings are distanced from each other by a distance of 5 micrometers. The resist pattern is used as a mask to carry out a selective wet etching process for selectively etching the multiple quantum well layer 1 to form a mesa-shaped waveguide having a width of 2 micrometers. The used resist pattern is removed. Two SiO$_2$ growth-stopper layers are selectively formed, before a selective low pressure epitaxy is carried out one time by use of the two SiO$_2$ growth-stopper layers to form a p-type current block layer, an n-type current block layer and a p-InP cladding layer 8 sequentially. In this case, the two SiO$_2$ growth-stopper layers do not extend over the mesa-shaped waveguide. In the growth process for the n-type current block layer, a super-saturation degree is increased, so that the n-type current block layer is not grown over the mesa-shaped waveguide. One time burying growth process forms the buried semiconductor laser having a thyristor structure. The p-electrode 7 and the n-electrode 9 are formed in the same manner as described in the first embodiment.

The present invention is applicable to any types of semiconductor lasers which has a cavity which further has two facets. In the above descriptions, the semiconductor laser is the InP based semiconductor laser, for example, a GaAs based short-wavelength semiconductor laser, a GaAs based visible-light emitting semiconductor laser, a GaN based blue-light emitting semiconductor laser and a ZnS-based blue-light emitting semiconductor laser.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor laser having at least a cavity, wherein said cavity satisfies the following equation:

$$L = A + B \times \ln(1/Rf)$$

where A and B are first and second constants, and L is a length of said cavity, and Rf is a reflectance factor of a front facet of said cavity.

2. The semiconductor laser as claimed in claim 1, wherein a length of said cavity is not less than 1.5 millimeters, and a reflectance factor of a front facet of said cavity is not more than 2%.

3. The semiconductor laser as claimed in claim 2, wherein said length of said cavity is not less than 2 millimeters, and said reflectance factor of said front facet of said cavity is not more than 1%.

4. The semiconductor laser as claimed in claim 3, wherein said length of said cavity is not less than 3.6 millimeters, and said reflectance factor of said front facet of said cavity is not more than 0.01%.

5. The semiconductor laser as claimed in claim 1, wherein in said equation, said first constant A and said second constant B are given by:

A = {1/(2×αm)}ln[1/(Rr)]; and

B = 1/(2×αm)

where αm is a mirror loss of said cavity, and said Rr is a reflectance factor of a rear facet of said cavity.

6. The semiconductor laser as claimed in claim 5, wherein a mirror loss of said cavity is not more than 13 cm$^{-1}$.

7. The semiconductor laser as claimed in claim 5, wherein a reflectance factor of a rear facet of said cavity is not less than 90%.

8. The semiconductor laser as claimed in claim 1, wherein said cavity has a width in the range of 1 micrometer to 10 micrometers.

9. The semiconductor laser as claimed in claim 1, wherein said cavity comprises at least a semiconductor layer interposed between a first semiconductor region of a first conductivity type and a second semiconductor region of a second conductivity type, and said semiconductor layer is lower in energy band gap than said first and second semiconductor regions, and said first and second semiconductor regions are respectively provided with first and second electrodes for a current injection.

10. The semiconductor laser as claimed in claim 9, wherein said at least semiconductor layer comprises a single quantum well structure.

11. The semiconductor laser as claimed in claim 9, wherein said at least semiconductor layer comprises a multiple quantum well structure.

12. The semiconductor laser as claimed in claim 9, wherein said semiconductor laser has at least a separate confinement hetero-structure.

13. The semiconductor laser as claimed in claim 9, wherein said semiconductor laser has at least a current confinement structure.

14. A semiconductor laser having at least a cavity, wherein said cavity satisfies the following equation:

$$\alpha m = (\tfrac{1}{2}L) \times \ln[1/(Rf \times Rr)]$$

where αm is the mirror loss of said cavity, L is the length of said cavity, Rf is the reflectance factor of a front facet of said cavity, and said Rr is a reflectance factor of a rear facet of said cavity, wherein said mirror loss of said cavity is not more than 13 cm$^{-1}$, and said reflectance factor of said rear facet of said cavity is not less than 90%, and wherein said length of said cavity is not less than 3.6 millimeters, and said reflectance factor of said front facet of said cavity is not more than 0.01%.

15. A semiconductor laser having at least a cavity, wherein said cavity satisfies the following equation:

$$\alpha m = (\tfrac{1}{2}L) \times \ln[1/(Rf \times Rr)]$$

where αm is the mirror loss of said cavity, L is the length of said cavity, Rf is the reflectance factor of a front facet of said cavity, and said Rr is a reflectance factor of a rear facet of said cavity, wherein said cavity has a width in the range of 1 micrometer to 10 micrometers.

16. A semiconductor laser having at least a cavity wherein a length of said cavity is not less than 3.6 millimeters, and a reflectance factor of a front facet of said cavity is not more than 0.01%.

17. A semiconductor laser having at least a cavity, wherein a length of said cavity is not less than 1.5 millimeters, and a reflectance factor of a front facet of said cavity is not more than 2%, wherein said cavity has a width in the range of 1 micrometer to 10 micrometers.

18. A method of designing a cavity of a semiconductor device, wherein the following equation is satisfied:

$$L = A + B \times \ln(1/Rf)$$

where A and B are first and second constants, and L is a length of said cavity, and Rf is a reflectance factor of a front facet of said cavity.

19. The method as claimed in claim 18, wherein a length of said cavity is not less than 1.5 millimeters, and a reflectance factor of a front facet of said cavity is not more than 2%.

20. The method as claimed in claim 19, wherein said length of said cavity is not less than 2 millimeters, and said reflectance factor of said front facet of said cavity is not more than 1%.

21. The method as claimed in claim 20, wherein said length of said cavity is not less than 3.6 millimeters, and said reflectance factor of said front facet of said cavity is not more than 0.01%.

22. The method as claimed in claim 18, wherein in said equation, said first constant A and said second constant B are given by:

A = {1/(2×αm)}ln[1/(Rr)]; and

B = 1/(2×αm)

where αm is a mirror loss of said cavity, and said Rr is a reflectance factor of a rear facet of said cavity.

23. The method as claimed in claim 22, wherein a mirror loss of said cavity is not more than 13 cm$^{-1}$.

24. The method as claimed in claim 22, wherein a reflectance factor of a rear facet of said cavity is not less than 90%.

25. The method as claimed in claim 18, wherein said cavity has a width in the range of 1 micrometer to 1 micrometers.

26. A method of designing a cavity of a semiconductor device, wherein said cavity satisfies the following equation:

$$\alpha m = (\tfrac{1}{2}L) \times \ln[1/(Rf \times Rr)]$$

where αm is the mirror loss of said cavity, L is the length of said cavity, Rf is the reflectance factor of a front facet of said cavity, and said Rr is a reflectance factor of a rear facet of said cavity, wherein said mirror loss of said cavity is not more than 13 cm$^{-1}$, and said reflectance factor of said rear facet of said cavity is not less than 90%, and wherein said length of said cavity is not less than 3.6 millimeters, and said reflectance factor of said front facet of said cavity is not more than 0.01%.

27. A method of designing a cavity of a semiconductor device, wherein said cavity satisfies the following equation:

$$\alpha m = (\tfrac{1}{2}L) \times \ln[1/(Rf \times Rr)]$$

where αm is the mirror loss of said cavity, L is the length of said cavity, Rf is the reflectance factor of a front facet of said cavity, and said Rr is a reflectance factor of a rear facet of said cavity, wherein said cavity has a width in the range of 1 micrometer to 10 micrometers.

28. A method of designing a cavity of a semiconductor device, wherein a length of said cavity is not less than 3.6 millimeters, and a reflectance factor of said front facet of said cavity is not more than 0.01%.

29. A method of designing a cavity of a semiconductor device, wherein a length of said cavity is not less than 1.5 millimeters, and a reflectance factor of a front facet of said cavity is not more than 2%, and wherein said cavity has a width in the range of 1 micrometer to 10 micrometers.

* * * * *